United States Patent
Cai et al.

(10) Patent No.: US 7,355,886 B1
(45) Date of Patent: Apr. 8, 2008

(54) METHOD OF PROGRAMMING, ERASING AND READING MEMORY CELLS IN A RESISTIVE MEMORY ARRAY

(75) Inventors: Wei Daisy Cai, Fremont, CA (US);
Swaroop Kaza, Sunnyvale, CA (US);
Colin S. Bill, Cupertino, CA (US);
Michael VanBuskirk, Saratoga, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/633,791

(22) Filed: Dec. 5, 2006

(51) Int. Cl.
*G11C 11/00* (2006.01)
(52) U.S. Cl. ............. 365/158; 365/185.18; 365/185.19
(58) Field of Classification Search ................. 365/158, 365/185.18, 185.19
See application file for complete search history.

(56) References Cited

U.S. PATENT DOCUMENTS 7,180,770 B2 * 2/2007 Perner et al. ............... 365/158
7,277,320 B2 * 10/2007 Ezaki et al. ................. 365/171

* cited by examiner

*Primary Examiner*—Son Dinh

(57) ABSTRACT

The present approach is a method of writing (which may be programming or erasing) data to a selected memory cell of a memory array. The array includes a plurality of word lines, a plurality of bit lines, a plurality of memory cells each including a diode and a resistive memory device in series connecting a word line and a bit line, and a plurality of transistors, each having a first and second source/drain terminals and a gate, each transistor having a first source/drain terminal connected to a bit line. In the present method a voltage is applied to a selected word line, and a voltage is applied to the second source/drain terminal of a transistor having its first source/drain terminal connected to a selected bit line. The voltage applied to the selected word line is greater than the voltage applied to the second source/drain terminal of that transistor.

25 Claims, 15 Drawing Sheets

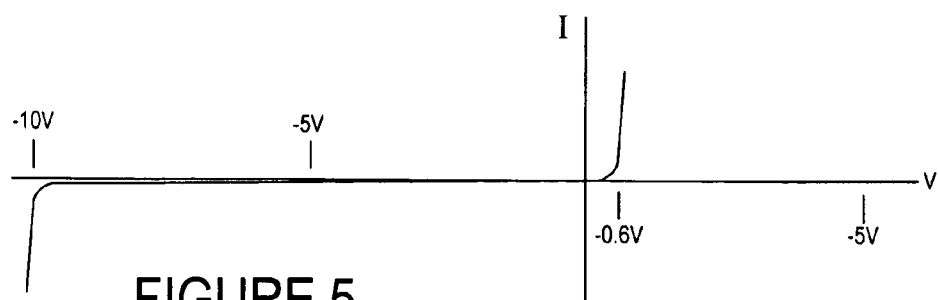
FIGURE 5
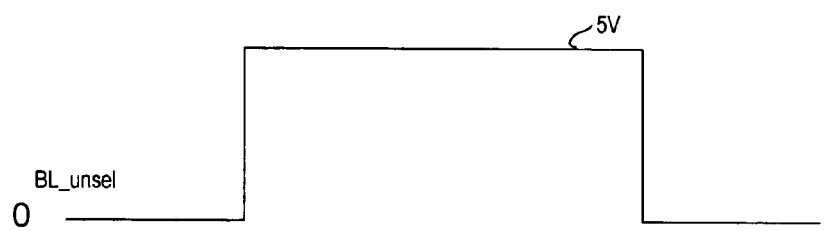
FIGURE 6

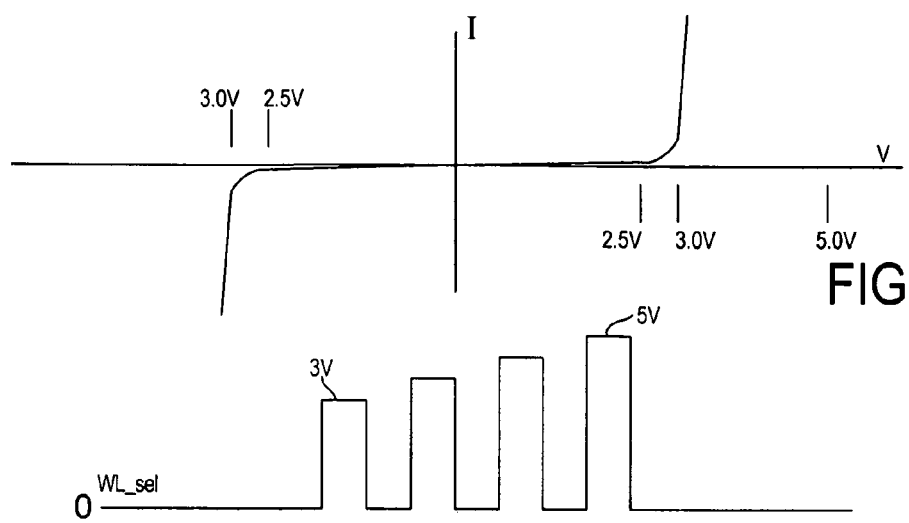
FIGURE 12
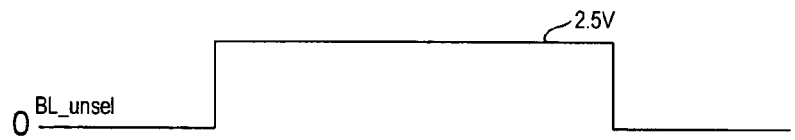
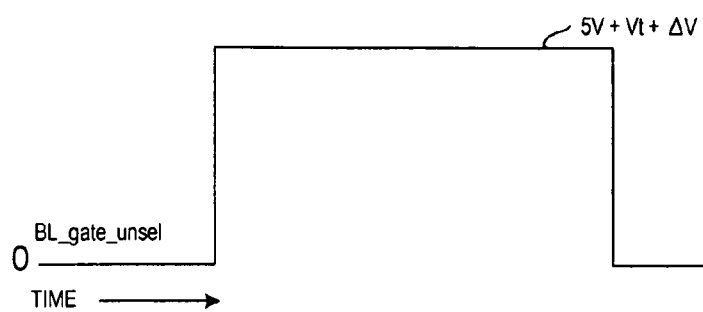
FIGURE 13

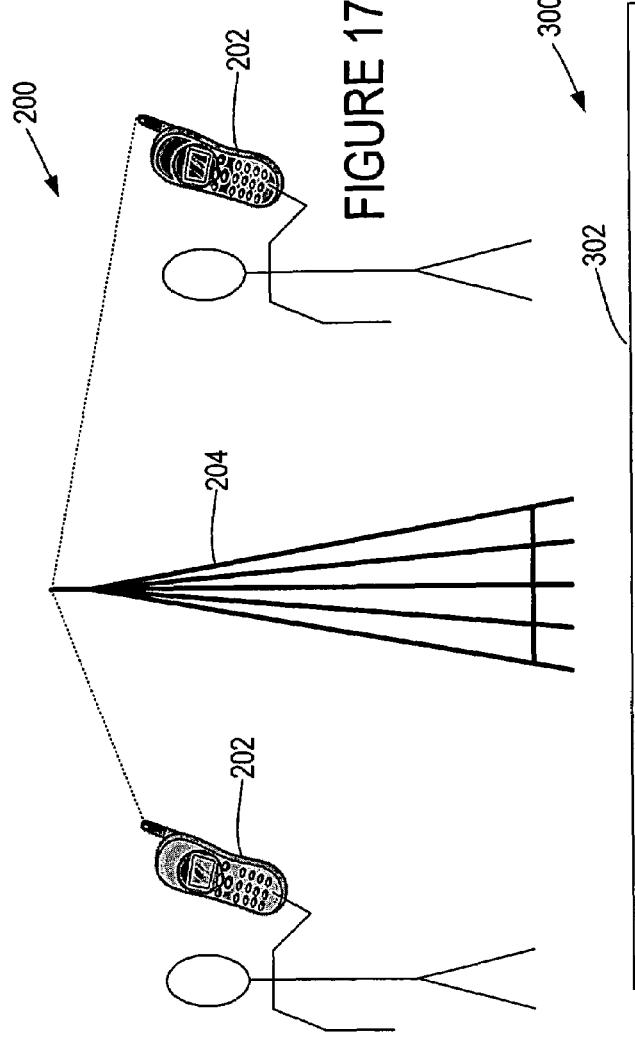
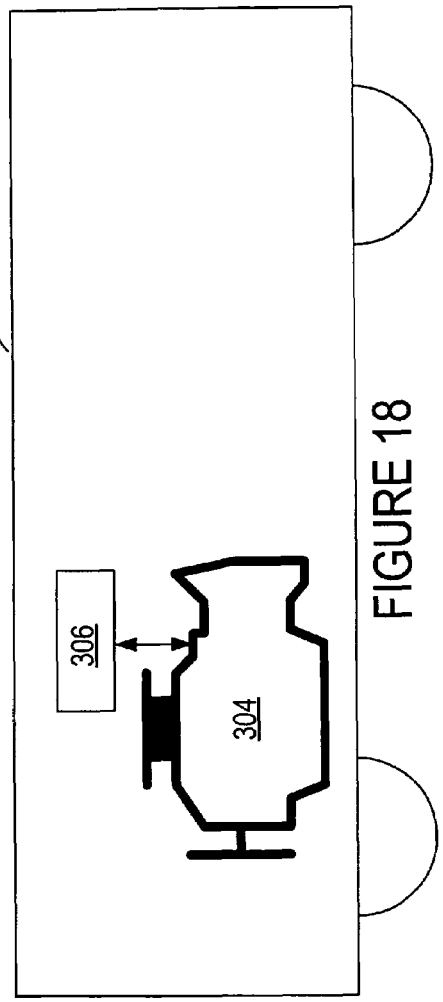

METHOD OF PROGRAMMING, ERASING AND READING MEMORY CELLS IN A RESISTIVE MEMORY ARRAY

BACKGROUND OF THE INVENTION

1. Technical Field

This invention relates generally to memory arrays, and more particularly, to a method of programming, erasing and reading memory cells which include resistive memory devices.

2. Background Art

FIG. 1 illustrates a memory device 30 known as a metal-insulator-metal (MIM) device which includes an electrode 32, an insulating layer 34 (also known as a switching layer) on and in contact with the electrode 32, and an electrode 36 on and in contact with the insulating layer 32, so the insulating layer 34 is between the electrodes 32, 36. The electrode 32 is connected to the drain of an MOS transistor 38, while the source of the transistor 38 is connected to ground, so that the memory device 30 and transistor 38 are in series. As will be described further on, the programming and erasing of the device 30 is undertaken by applying an electrical potential from higher to lower potential in the same direction for both.

Initially, assuming that the memory device 30 is unprogrammed, in order to program the memory device 30, a programming voltage $V_{pg}$ is applied to the electrode 36, so that an electrical potential is applied across the memory device 30 from a higher to a lower potential in the direction from electrode 36 to electrode 32, (see FIG. 2, a plot of memory device current vs. voltage applied to the electrode 36 of the memory device 30). This voltage $V_{pg}$ is sufficient to cause charge carriers to be moved into the insulating layer 34, causing the insulating layer 34 (and the overall memory device 30) to rapidly switch to a low-resistance or conductive state (A). Upon removal of such potential, the charge carriers moved into the insulating layer 34 during the programming step remain therein, so that the insulating layer 34 (and memory device 30) remain in a conductive or low-resistance state, as indicated by the on-state resistance characteristic (B). The voltage $V_{ga}$ applied to the gate of the transistor 38 determines the magnitude of current through the memory device 30 during the programming step.

In order to erase the memory device 30, a positive voltage $V_{er}$ is applied to the electrode 36, so that an electrical potential is applied across the memory device 30 from a higher to a lower electrical potential in the same direction as in programming the device 30. This potential $V_{er}$ is sufficient to cause charge carriers to move from the insulating layer 34, in turn causing the insulating layer 34 (and the overall memory device 30) to be in a high-resistance or substantially non-conductive state. This state remains upon removal of such potential from the memory device 30. The gate voltage $V_{gb}$ again determines the magnitude of current through the memory device 30 and is generally set higher than the gate voltage $V_{gb}$ applied during programming. As illustrated, the erase voltage $V_{er}$ is lower than the programming voltage $V_{pg}$, and the current provided through the memory device 30 during the erase step (C) is higher than the current through the device 30 during the programming step (based on a higher gate voltage during the erase step than during the programming step).

FIG. 2 also illustrates the read step of the memory device 30 in its programmed (conductive) state and in its erased (nonconductive) state. A voltage $V_r$ is applied to the electrode 36 so that an electrical potential across the memory device 30 from a higher to a lower electrical potential in the same direction as in the programming and erase steps. This voltage $V_r$ is lower than the voltage $V_{pg}$ applied for programming and is lower than the voltage $V_{er}$ applied for erasing (see above). In this situation, if the memory device 30 is programmed, the memory device 30 will readily conduct current, indicating that the memory device 30 is in its programmed state. If the memory device 30 is erased, the memory device 30 will not conduct current, indicating that the memory device 30 is in its erased state.

It will be understood that memory devices of the type shown and described above are part of an array which includes a very large number of memory cells each of which is to be individually programmed, erased and read as needed. For such an array, what is needed is an approach for programming, erasing and reading the memory cells, which approach is simple and effective.

DISCLOSURE OF THE INVENTION

Broadly stated, the present approach is a method of writing data to a selected memory cell of a memory array, the array comprising a plurality of word lines, a plurality of bit lines, a plurality of memory cells each comprising a diode and a resistive memory device in series connecting a word line and a bit line, and a plurality of transistors, each having first and second source/drain terminals and a gate, each transistor having a first source/drain terminal connected to a bit line, the method comprising applying a voltage to a selected word line, and applying a voltage to the second source/drain terminal of a transistor having its first source/drain terminal connected to a selected bit line, the voltage applied to the selected word line being greater than the voltage applied to the second source/drain terminal of the transistor having its first source/drain terminal connected to the selected bit line.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein:

FIG. 5 illustrates a diode characteristic of a first embodiment of diode in the memory array;

FIG. 6 is a timing diagram illustrating application of voltages to the array incorporating the first embodiment of diode in the programming of a selected memory cell thereof;

FIG. 12 illustrates a diode characteristic of a second embodiment of diode in the memory array;

FIG. 13 is a timing diagram illustrating application of voltages to the array incorporating the second embodiment of diode in the programming of a selected memory cell thereof;

FIGS. 17-19 are systems incorporating memory devices of the present type.

BEST MODE(S) FOR CARRYING OUT THE INVENTION

Reference is now made in detail to specific embodiments of the present invention which illustrate the best mode presently contemplated by the inventors for practicing the invention.

Figure 3:
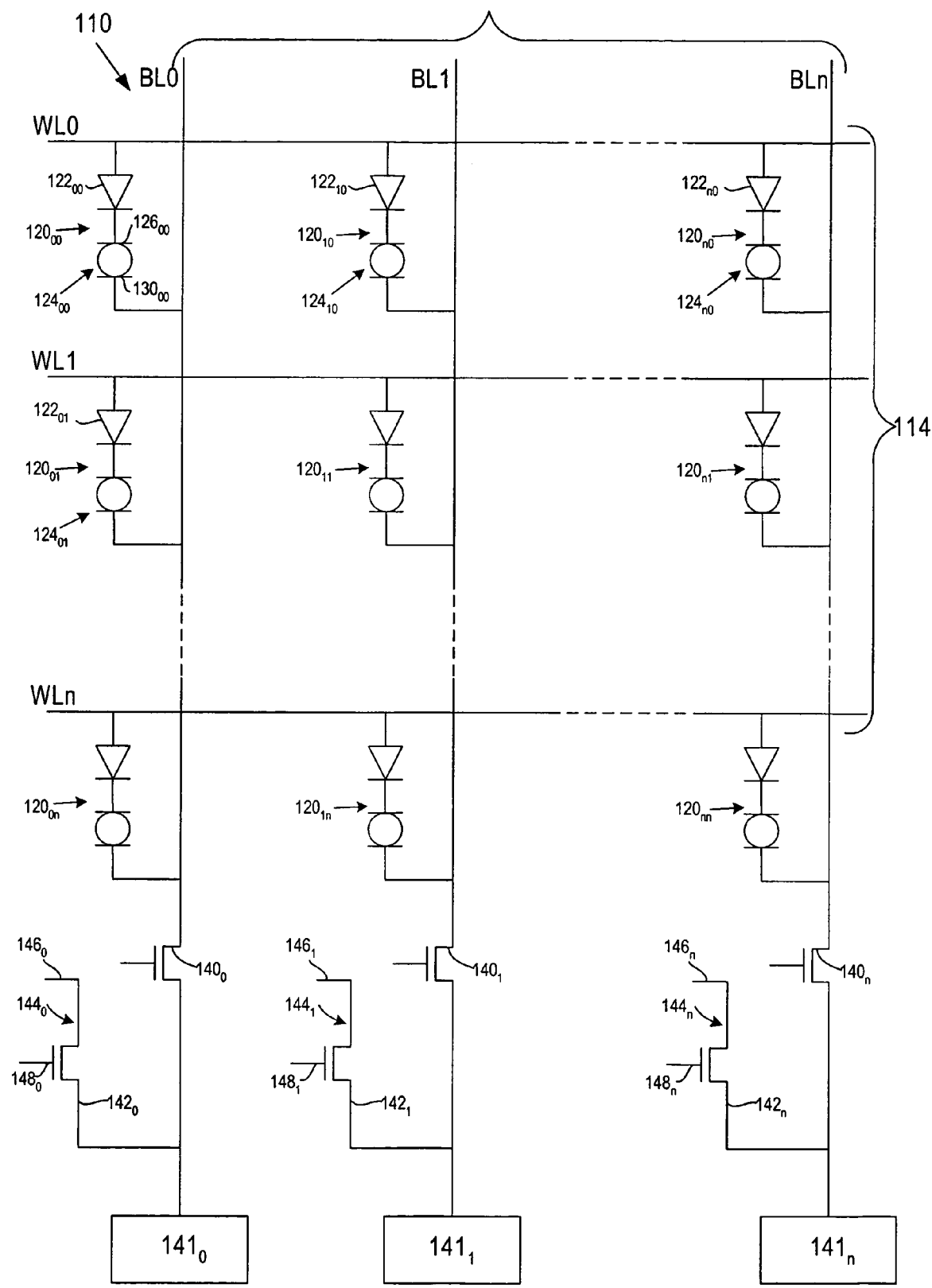
FIG. 3 is a schematic illustration of a memory array for illustrating the present invention.

FIG. 3 illustrates a memory array 110. The array 110 includes a first plurality of parallel conductors 112 (bit lines) BL0, BL1, . . . BLn, and a second plurality of parallel conductors 114 (word lines) WL0, WL1, . . . WLn overlying and spaced from, orthogonal to, and crossing the first plurality of conductors 112. A plurality of memory cells $120_{00}$, $120_{10}$, . . . $120_{nm}$ are included in the array 110. Each memory cell 120 includes a diode 122 and a resistive memory device 124 (of the type described above, including electrodes 126, 130 and insulator layer 128 between and in contact with the electrodes 126, 130, i.e., a MIM) in series connecting a conductor WL of the plurality thereof with a conductor BL of the plurality thereof at the intersection of those conductors, with diode 122 thereof in a forward direction from the conductor WL to the conductor BL. For example, as shown in FIG. 3, in the memory cell $120_{00}$, diode $122_{00}$ and resistive memory device $124_{00}$ in series connect WL0 with BL0, in the memory cell $120_{01}$, diode $122_{01}$ and resistive memory device $124_{01}$ in series connect WL1 with BL0, etc. Each bit line BL0, BL1, . . . BLn respectively connects through a Y-decoder transistor $140_0$, $140_1$, . . . $140_n$ with a sense amplifier $141_0$, $141_1$, . . . $141_n$ and with a source/drain terminal $142_0$, $142_1$, . . . $141_n$ of a transistor $144_0$, $144_1$, . . . $144_n$. Each transistor $144_0$, $144_1$, . . . $144_n$ also includes another source/drain terminal ($146_0$, $146_1$, . . . $146_n$ respectively) and a gate ($148_0$, $148_1$, . . . $148_n$ respectively) as in well known.

To aid in understanding programming, erasing and reading of a cell in the array 110, voltages applied to various parts of the array 110 are noted in general terms in FIG. 4, and reference is made to various timing diagrams as will be described.

Figure 4:
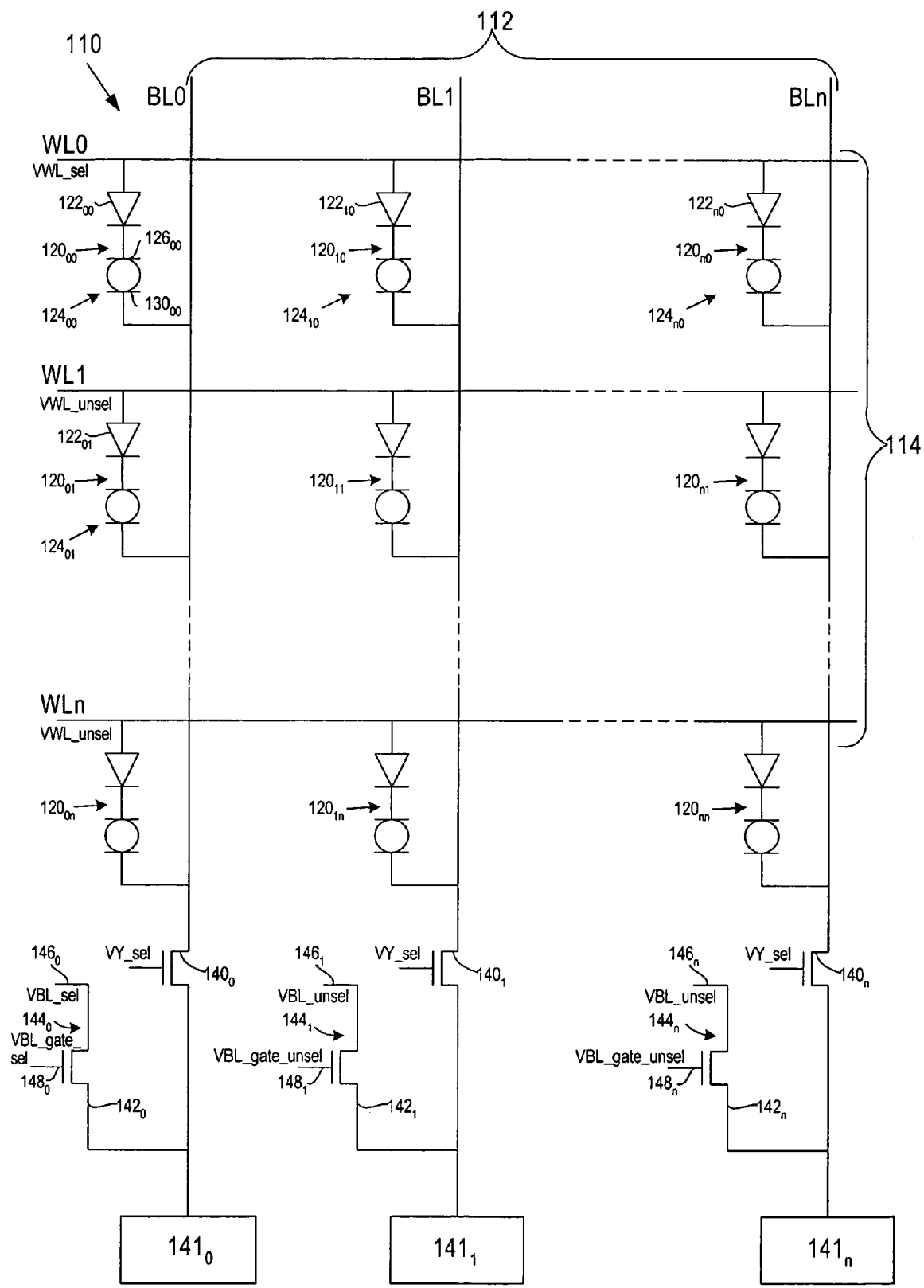
FIG. 4 is a view similar to FIG. 3 and showing application of voltages to portions thereof.

FIG. 4 illustrates in general terms the programming, erasing, and reading of a cell of the array 110. That is, with all Y-decoder transistors $140_0$, $140_1$, . . . $140_n$ on (Y_sel high), for a selected cell (in this example cell $120_{00}$), VWL_sel is applied to word line WL0, VWL_unsel is applied to all other word lines WL1, . . . WLn, VBL_sel is applied to the source/drain terminal $146_0$ of transistor $144_0$, VBL_unsel is applied to the source/drain terminals $146_1$, . . . $146_n$ of all the other transistors $144_1$, . . . $144_n$, VBL_gate_sel is applied to the gate $148_0$ of the transistor $144_0$, and VBL_gate_unsel is applied to the gates $148_1$, . . . $148_n$ of all the other transistors $144_1$, . . . $144_n$.

FIG. 5 illustrates the diode characteristic of a first embodiment of diode 122 incorporated throughout the array 120. As shown, such a diode has a relatively low forward threshold, in this case 0.6V, and a relatively high reverse breakdown voltage, in this case −10V.

Figure 1:
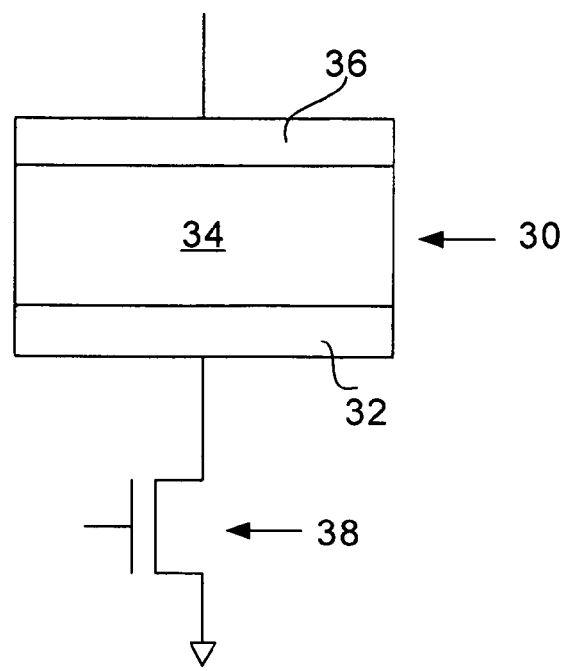
FIG. 1 is a cross-sectional view of the memory device as described above.
Figure 2:
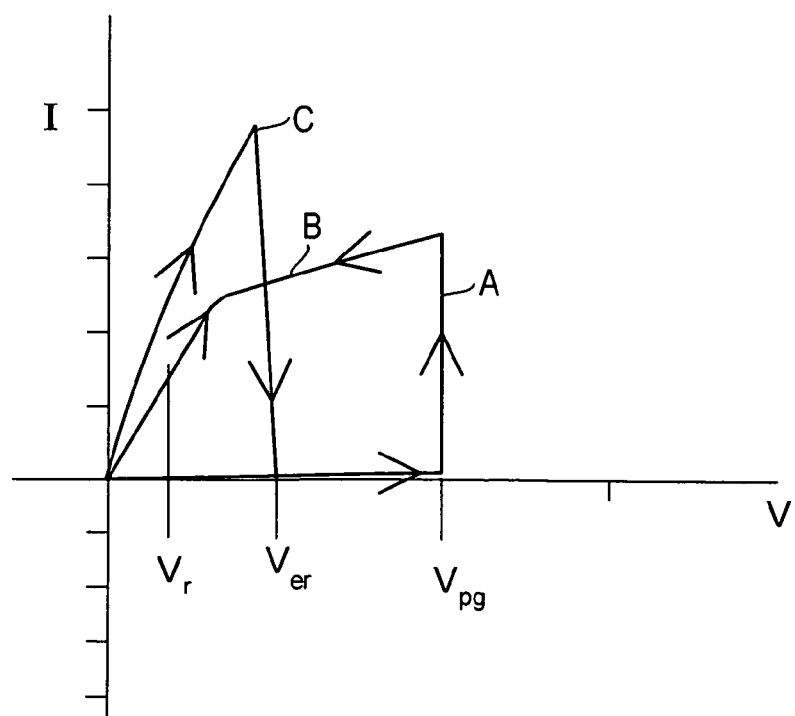
FIG. 2 is a plot of current vs. voltage in the programming, reading and erasing of the memory device of FIG. 1.

In the programming of the cell $120_{00}$ of an array 110 incorporating such diodes 122, the signals of FIG. 6 are applied to the various parts of the array 110. The voltage VWL_sel is applied to the word line WL0 in successive increasing pulses up to Vpg_max, in this example 5V. (Vpg, FIG. 2). Prior to the first pulse, Vpg_max (5V) is applied as VBL_unsel to the source/drain terminals $146_1$, . . . $146_n$ of the other transistors $144_1$, . . . $144_n$, ending after the pulse Vpg_max for word line WL0. At the same time as Vpg_max (5V) is applied to the source/drain terminals $146_1$, . . . $146_n$ of the other transistors $144_1$, . . . $144_n$, VBL_gate_sel (in this example 1V) is applied to the gate $148_0$ of the transistor $144_0$, and Vpg_max+Vt+ΔV is applied as VBL_gate_unsel to the gates $148_1$, . . . $148_n$ of the other transistors $144_1$, . . . $144_n$, where Vt=threshold voltage of transistor 144 and ΔV=an additional voltage to provide adequate current conduction. Throughout the programming of the cell $120_{00}$, VWL_unsel and VBL_sel are held at 0V. The voltage drop between WL0 and the source/drain terminal $146_0$ of the transistor $144_0$ increases from 0V to 5V during the pulsing of the voltage applied to WL0, and causes the memory device $124_{00}$ to adopt a low-resistance state, causing the cell $122_{00}$ to be programmed (FIGS. 1 and 2). The application of Vpg_max to the source/drain terminals $146_1$, . . . $146_n$ of the transistors $144_1$, . . . $144_n$, along with the application of Vpg_max+Vt+ΔV to the gates $148_1$, . . . $148_n$ of the transistors $144_1$, . . . $144_n$ (ΔV being provided to insure that transistors $144_1$, . . . $144_n$ are fully turned on so that Vpg_max is applied to the bit lines BL1, . . . BLn), and the other diodes of the array 110, which act as select diodes, insure that the other cells are not disturbed during programming of the cell $120_{00}$.

Figure 7:
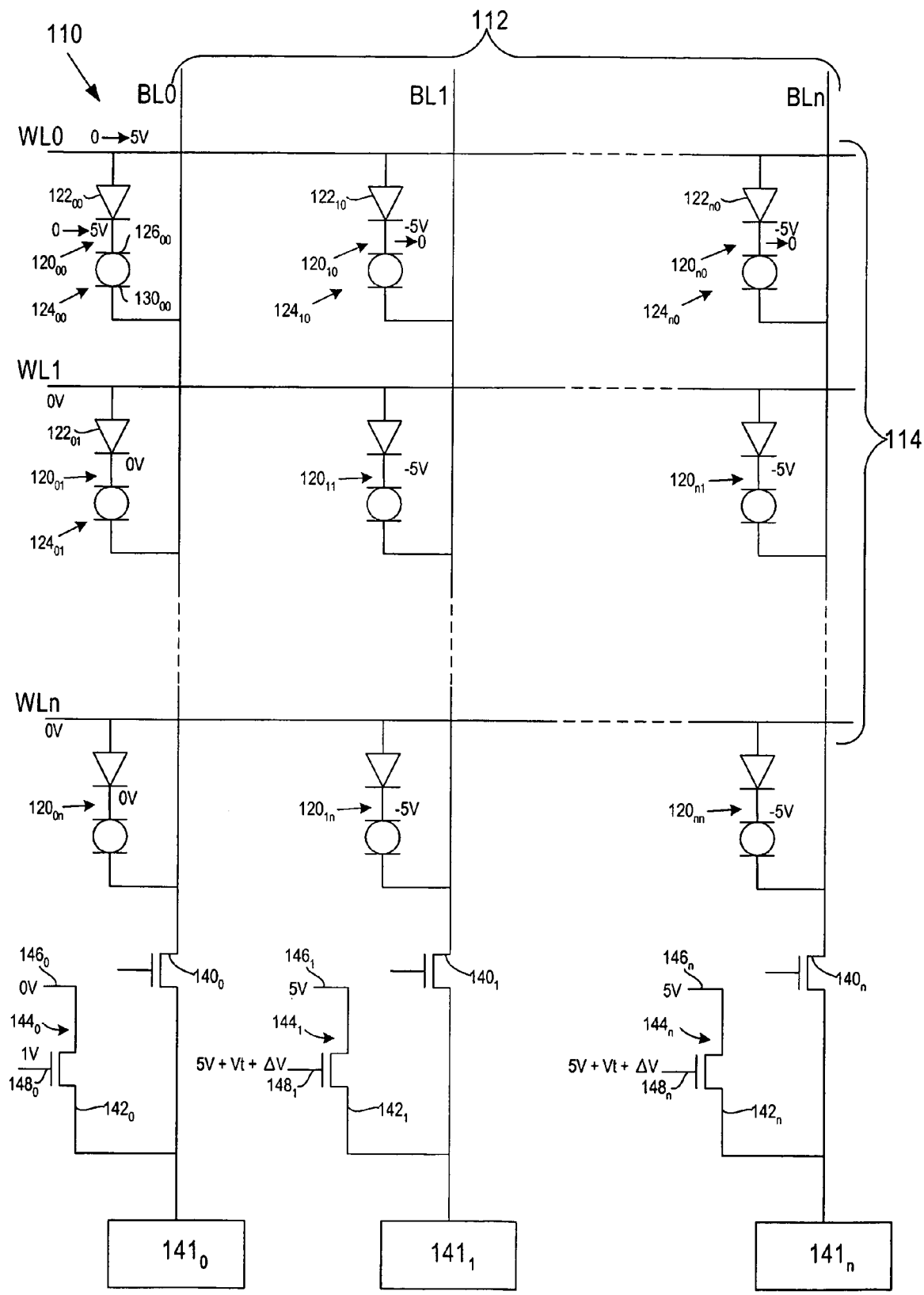
FIG. 7 is a view of the array incorporating the first embodiment of diode showing application of specific voltages to portions thereof in accordance with the timing diagram of FIG. 6.

FIG. 7 illustrates these particular voltages as applied to the array 110. For the unselected cells connected to WL0, during the pulsing of the voltage applied to WL0, the voltage thereacross goes from −5V to 0V. This −5V, applied in the reverse direction of the diode of each such cell, is substantially lower than the breakdown voltage (−10V) of the diode. In addition, the unselected cells connected to BL0 have 0 volts thereacross. Furthermore, for the unselected cells not connected to WL0 and BL0, the voltage across each such unselected cell is −5V in the reverse direction of the diode thereof. Again, this −5V is substantially lower than the breakdown voltage (−10V) of the associated diode to. Thus the diodes of the unselected cells properly act as select diodes.

Figure 8:
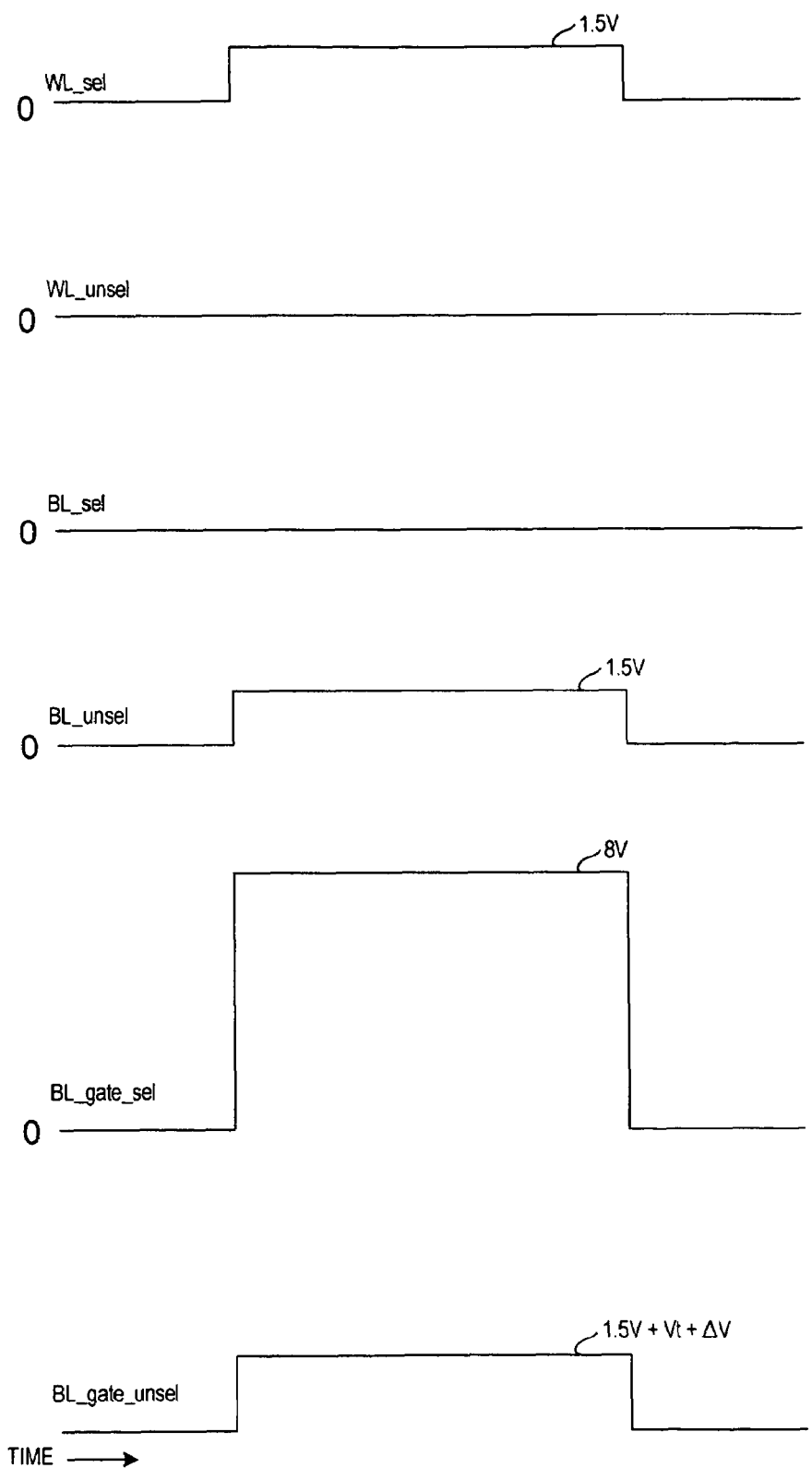
FIG. 8 is a timing diagram illustrating application of voltages to the array incorporating the first embodiment of diode in a first embodiment of erasing of a selected memory cell thereof.

In the erasing of the cell $120_{00}$, the signals of FIG. 8 are applied to the various parts of the array 110. The voltage VWL_sel is applied to the word line WL0 as Ver, lower than Vpg_max (in this example Ver=1.5V—this voltage may also be applied in the form of successive increasing pulses, starting at m 1V and increasing to 1.5V)). At the same time, Ver (1.5V) is applied as VBL_unsel to the source/drain terminals $146_1, \ldots 146_n$ of the other transistors $144_1, \ldots 144_n$. At the same time as Ver is applied to the source/drain terminals $146_1, \ldots 146_n$ of the other transistors $144_1, \ldots 144_n$, VBL_gate_sel (8V) is applied to the gate $148_0$ of transistor $144_0$ (greater than the voltage applied in programming to provide higher current through the memory device $124_{00}$), and Ver+Vt+ΔV is applied as VBL_gate_unsel to the gates $148_1, \ldots 148_n$ of the other transistors $144_1, \ldots 144_n$, where Vt=threshold voltage of transistor 144, and ΔV=an additional voltage to provide adequate current conduction. Throughout the erasing of the cell $120_{00}$, VWL_unsel and VBL_sel are held at 0. The voltage drop between WL0 and the source/drain terminal $146_0$ of the transistor $144_0$ causes the memory device $124_{00}$ to adopt a high-resistance state, causing the cell $120_{00}$ to be erased. The application of Ver to the source/drain terminals $146_1, \ldots 146_n$ of the transistors $144_1, \ldots 144_n$, along with the application of Ver+Vt+ΔV to the gates $148_1, \ldots 148_n$ of the transistors $144_1, \ldots 144_n$ (ΔV being provided to insure that transistors $144_1, \ldots 144_n$ are fully turned on so that Ver is applied to the bit lines BL1, . . . BLn), and the other diodes, which act as select diodes, insure that the other cells of the array 110 are not disturbed during erasing of the cell $120_{00}$.

Figure 9:
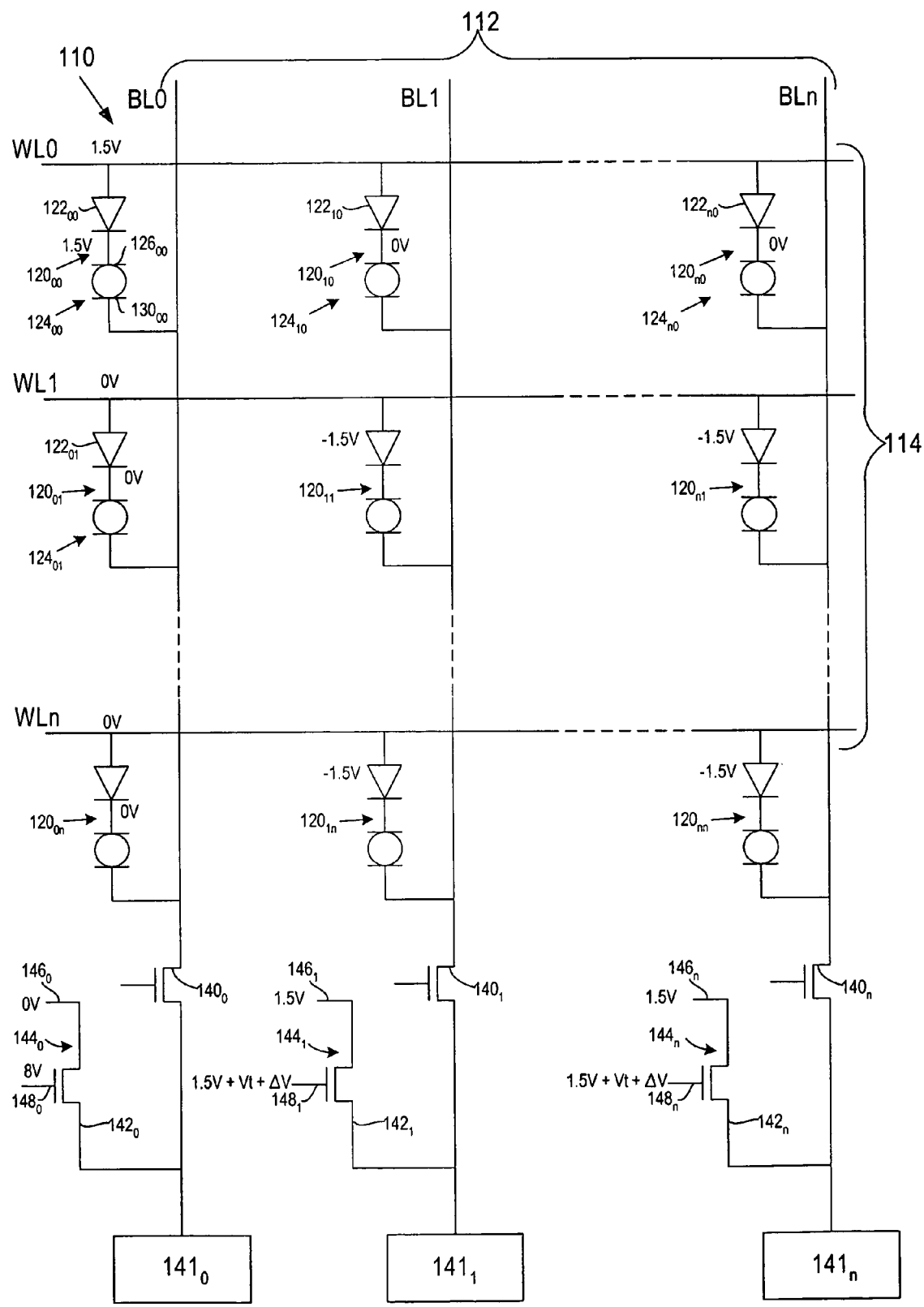
FIG. 9 is a view of the array incorporating the first embodiment of diode showing application of specific voltages to portions thereof in accordance with the timing diagram of FIG. 8.

FIG. 9 illustrates these particular voltages as applied to the array 110. For the unselected cells connected to WL0 and BL0, during application of 1.5V to WL0, the voltage thereacross is 0V. Furthermore, for the unselected cells not connected to WL0 and BL0, the voltage across each such unselected cell is −1.5V in the reverse direction of the diode thereof. This −1.5V is substantially lower than the breakdown voltage (−10V) of the associated diode. Thus the diodes of the unselected cells properly act as select diodes.

Figure 10:
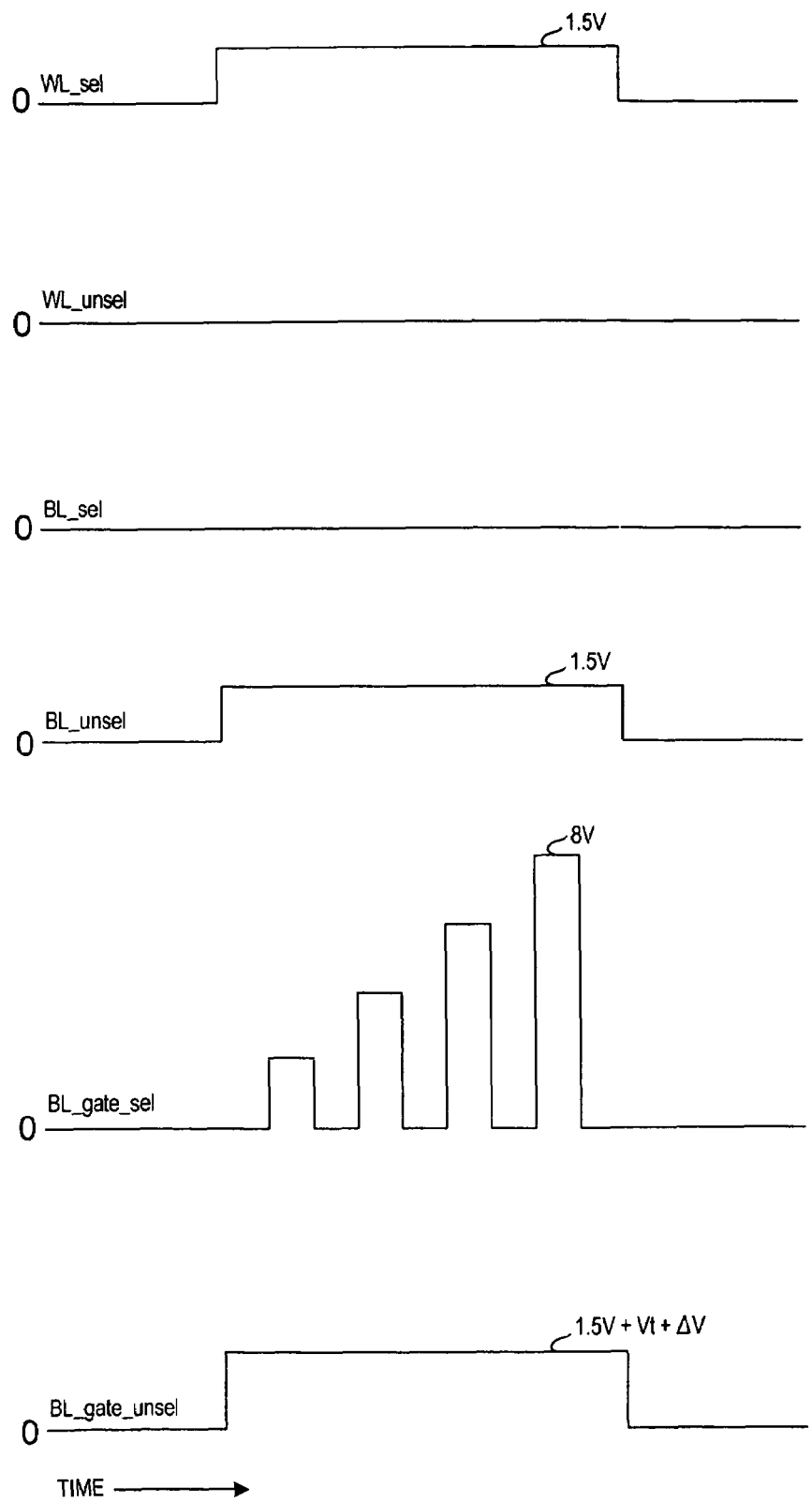
FIG. 10 is a timing diagram illustrating application of voltages to the array incorporating the first embodiment of diode in a second embodiment of erasing of a selected memory cell thereof.

FIG. 10 illustrates a timing diagram for a second embodiment of erasing a selected memory cell of an array 110. The timing diagram of FIG. 10 is similar to that of FIG. 8, with the exception that the voltage applied to BL_gate_sel is applied in successive increasing voltages up to a maximum of 8V.

Figure 11:
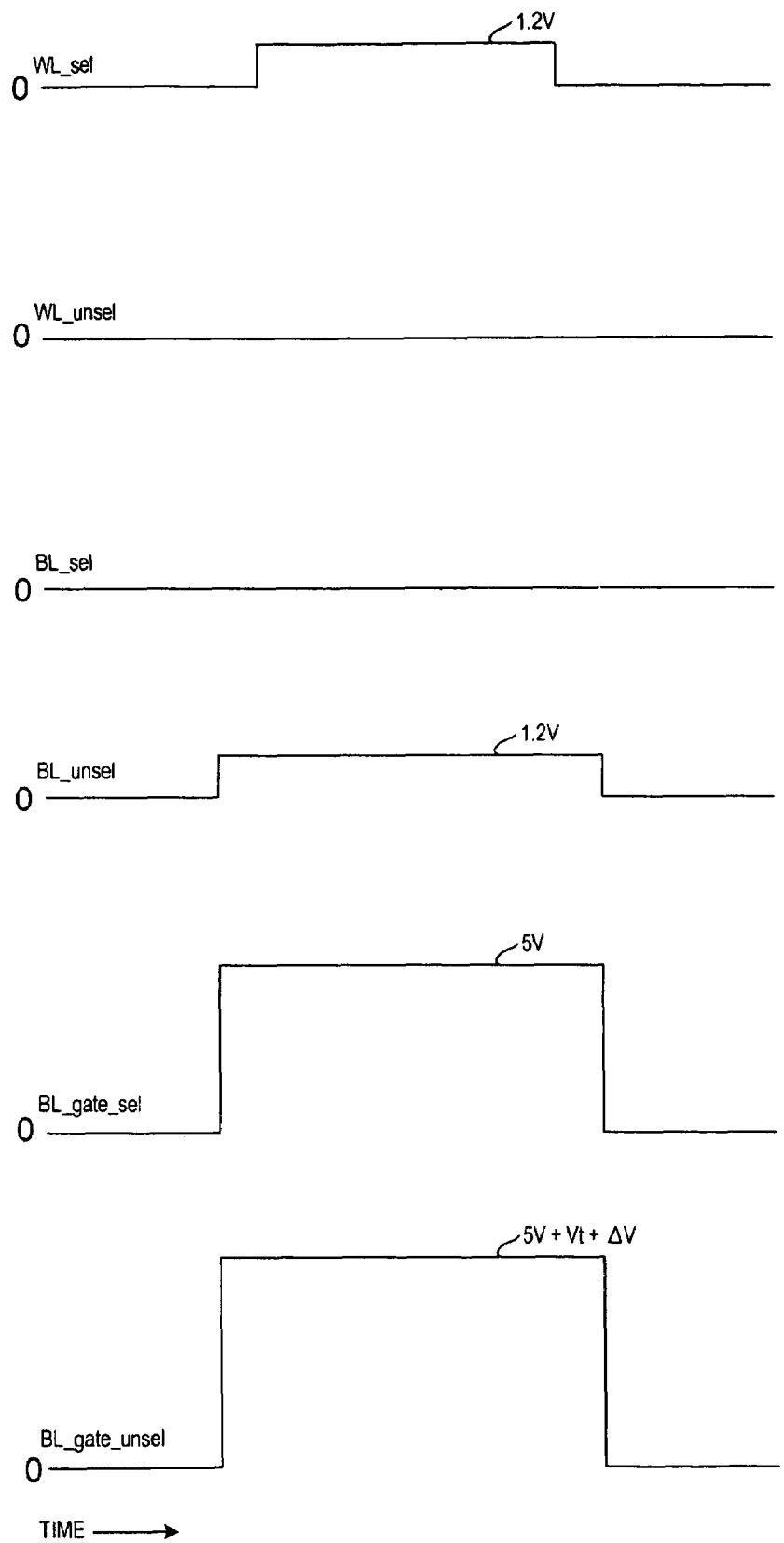
FIG. 11 is a timing diagram illustrating application of voltages to the array incorporating the first embodiment of diode in the reading of a selected memory cell thereof.

In reading the state of the cell $120_{00}$, voltages are applied as in FIG. 11. Generally a read operation is undertaken after each program or erase pulse to determine if the required state has been achieved and whether a further pulse is necessary.

FIG. 12 illustrates the diode characteristic of a second embodiment of diode 122 incorporated throughout the array 110. As shown, such a diode has symmetrical forward and reverse characteristics, having a forward threshold voltage threshold of 3V, and a reverse threshold or breakdown voltage of 3V.

In the programming of the cell $120_{00}$ of an array 110 incorporating such diodes 122, the signals of FIG. 13 are applied to the various parts of the array 110. The voltage VWL_sel is applied to the word line WL0 in successive increasing pulses up to Vpg_max, in this example 5V. Prior to the first pulse, 2.5V is applied as VBL_unsel to the source/drain terminals $146_1, \ldots 146_n$ of the other transistors $144_1, \ldots 144_n$, ending after the pulse Vpg_max (5V) for word line WL0. At the same time as 2.5V is applied to the source/drain terminals $146_1, \ldots 146_n$ of the other transistors $144_1, \ldots 144_n$, VBL_gate_sel (in this example 1V) is applied to the gate $148_0$ of the transistor $144_0$, and Vpg_max+Vt+ΔV is applied as VBL_gate_unsel to the gates $148_1, \ldots 148_n$ of the other transistors $144_1, \ldots 144_n$, where Vt=threshold voltage of transistor 144 and ΔV=an additional voltage to provide adequate current conduction. 2.5V is also applied as WL_unsel. Throughout the programming of the cell VBL_sel is held at 0V. The voltage drop between WL0 and the source/drain terminal $146_0$ of the transistor $144_0$ increases from 0V to 5V during the pulsing of the voltage applied to WL0, and causes the memory device $124_{00}$ to adopt a low-resistance state, causing the cell $122_{00}$ to be programmed (FIGS. 1 and 2). The application of 2.5V to the source/drain terminals $146_1, \ldots 146_n$ of the transistors $144_1, \ldots 144_n$, along with the application of Vpg_max+Vt+ΔV to the gates $148_1, \ldots 148_n$ of the transistors $144_1, \ldots 144_n$ (ΔV being provided to insure that transistors $144_1, \ldots 144_n$ are fully turned on so that Vpg_max is applied to the bit lines BL1, . . . BLn), and the other diodes of the array 110, which act as select diodes, insure that the other cells are not disturbed during programming of the cell $120_{00}$.

Figure 14:
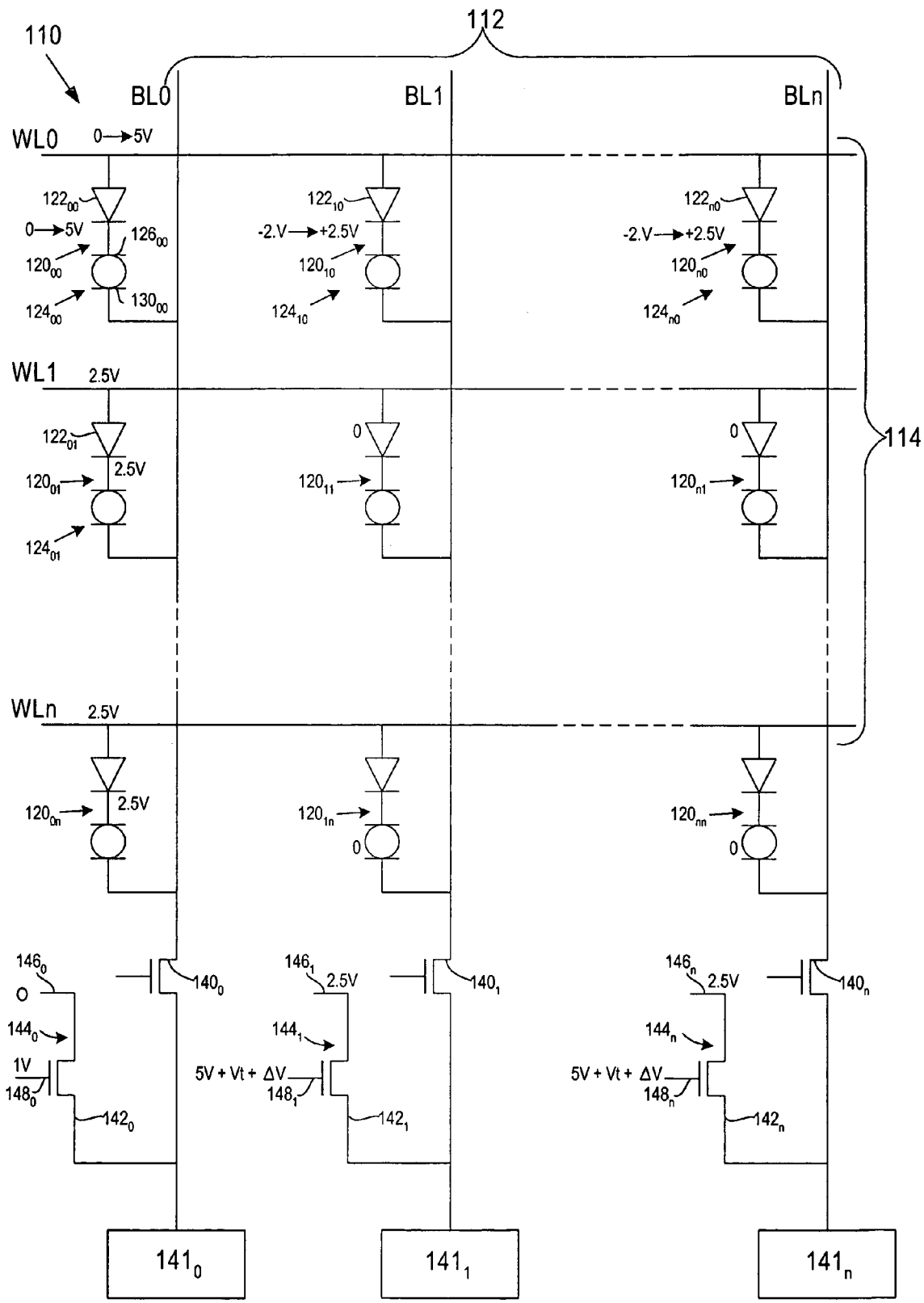
FIG. 14 is a view of the array showing application of specific voltages to portions thereof in accordance with the timing diagram of FIG. 13.

FIG. 14 illustrates these particular voltages as applied to the array 110. For the unselected cells connected to WL0, during the pulsing of the voltage applied to WL0, the voltage thereacross goes from −2.5V to 2.5V. These voltages are less than the reverse and forward threshold of the diode (−3V, 3V). In addition the voltage across each unselected cell connected to BL0 is 2.5V, below the threshold of the diode thereof. Furthermore, for the unselected cells not connected to WL0 and BL0, the voltage across each such unselected cell is 0V. Thus the diodes of the unselected cells properly act as select diodes. Additionally, with the substantial majority of cells in the array having no potential applied thereacross, currently leakage in the array is minimal.

Figure 15:
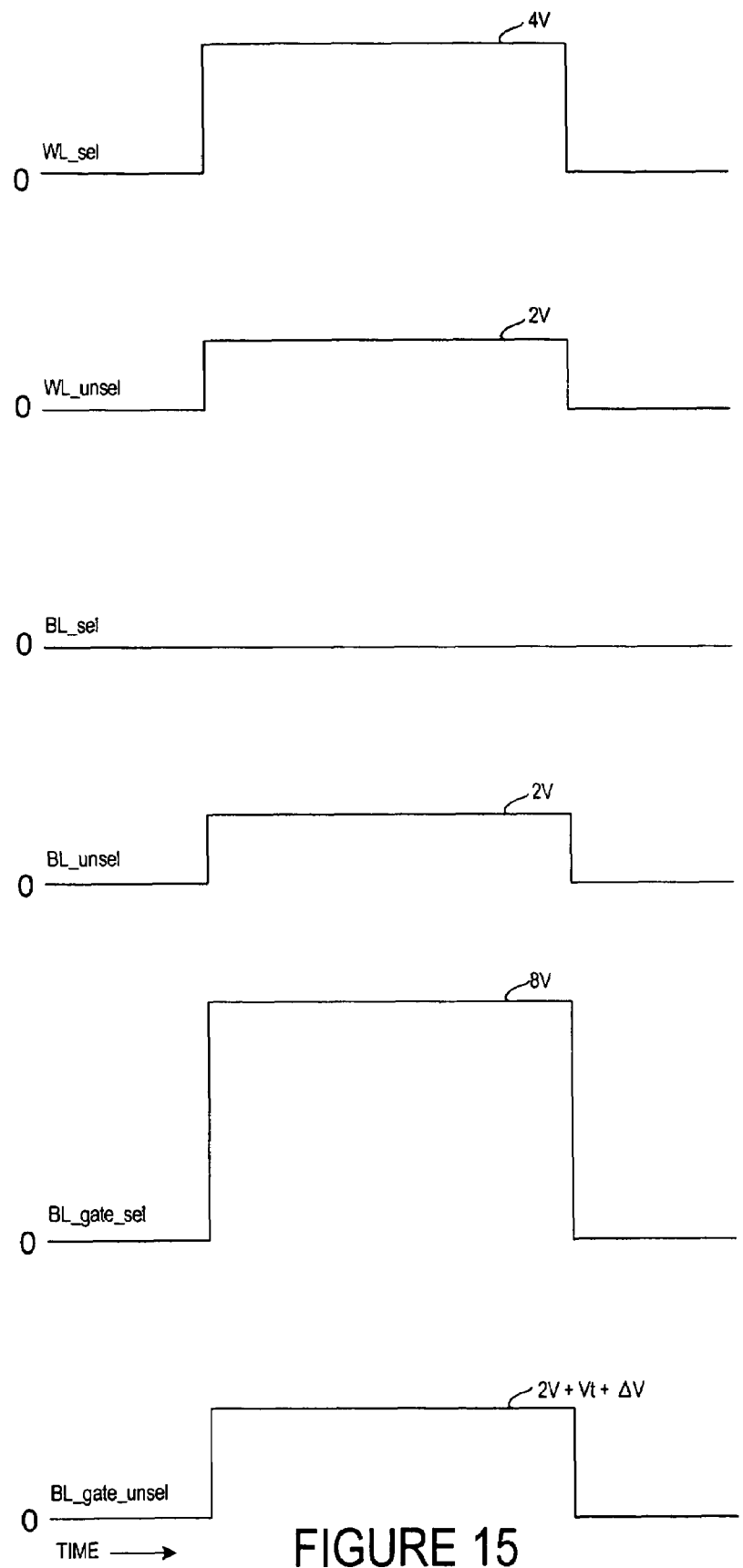
FIG. 15 is a timing diagram illustrating application of voltages to the array incorporating the second embodiment of diode in a first embodiment of erasing of a selected memory cell thereof.

In the erasing of the cell $120_{00}$, the signals of FIG. 15 are applied to the various parts of the array 110. The voltage VWL_sel is applied to the word line WL0 as Ver, lower than Vpg_max (in this example Ver=4V). At the same time, Ver (2V) is applied as VBL_unsel to the source/drain terminals $146_1, \ldots 146_n$ of the other transistors $144_1, \ldots 144_n$. At the same time as Ver is applied to the source/drain terminals $146_1, \ldots 146_n$ of the other transistors $144_1, \ldots 144_n$, VBL_gate_sel (8V) is applied to the gate $148_0$ of transistor $144_0$ (greater than the voltage applied in programming to provide higher current through the memory device $124_{00}$), and Ver+Vt+ΔV is applied as VBL_gate_unsel to the gates $148_1, \ldots 148_n$ of the other transistors $144_1, \ldots 144_n$, where Vt=threshold voltage of transistor 144, and ΔV=an additional voltage to provide adequate current conduction. Throughout the erasing of the cell $120_{00}$, VBL_sel is held at 0V. 2V is applied to WL_unsel. The voltage drop between WL0 and the source/drain terminal $146_0$ of the transistor $144_0$ causes the memory device $124_{00}$ to adopt a high-resistance state, causing the cell $120_{00}$ to be erased. The application of Ver to the source/drain terminals $146_1, \ldots 146_n$ of the transistors $144_1, \ldots 144_n$, along with the application of Ver+Vt+ΔV to the gates $148_1, \ldots 148_n$ of the transistors $144_1, \ldots 144_n$ (ΔV being provided to insure that transistors $144_1, \ldots 144_n$ are fully turned on so that Ver is applied to the bit lines BL1, . . . BLn), and the other diodes, which act as select diodes, insure that the other cells of the array 110 are not disturbed during erasing of the cell $120_{00}$.

Figure 16:
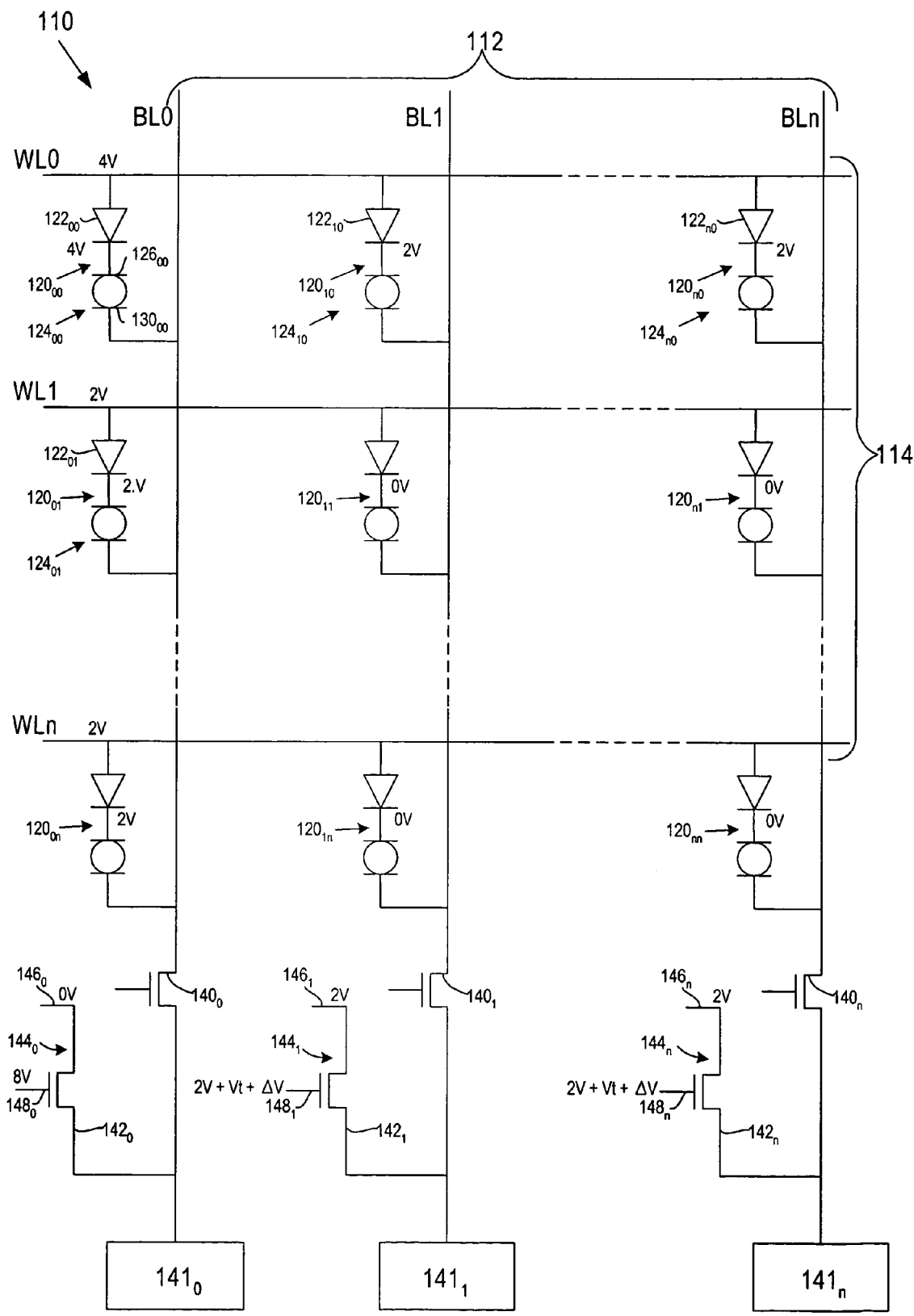
FIG. 16 is a view of the array incorporating the second embodiment of diode showing application of specific voltages to portions thereof in accordance with the timing diagram of FIG. 15.

FIG. 16 illustrates these particular voltages as applied to the array 110. For the unselected cells connected to BL0, during application of 4V to WL0, the voltage thereacross is 2V. For the unselected cells connected to WL0, during application of 4V to WL0, the voltage thereacross is 2V. Furthermore, for the unselected cells not connected to WL0 and BL0, the voltage across each such unselected cell is 0. All of these voltages are between the forward and reverse thresholds of the diodes. Thus the diodes of the unselected cells properly act as select diodes. Additionally, with the substantial majority of cells in the array having no potential applied thereacross, currently leakage in the array is minimal.

During the erase procedure, the voltage applied as BL_gate_sel may be applied as a series of successive, increasing pulse was up to 8V.

The read step of a selected cell is undertaken in the manner previously described.

FIG. 17 illustrates a system 200 utilizing memory devices as described above. As shown therein, the system 200 includes hand-held devices in the form of cell phones 202, which communicate through an intermediate apparatus such as a tower 204 (shown) and/or a satellite. Signals are provided from one cell phone to the other through the tower 204. Such a cell phone 202 with advantage uses memory devices of the type described above for data storage, for example names, telephone number and other data. One skilled in the art will readily understand the advantage of using such memory devices in other hand-held devices which utilize data storage, such as portable media players, personal digital assistants, digital cameras and the like.

FIG. 18 illustrates another system 300 utilizing memory devices as described above. The system 300 includes a vehicle 302 having an engine 304 controlled by an electronic control unit 306. The electronic control unit 306 with advantage uses memory devices of the type described above for data storage, for example data relating to engine and vehicle operating conditions.

Figure 19:
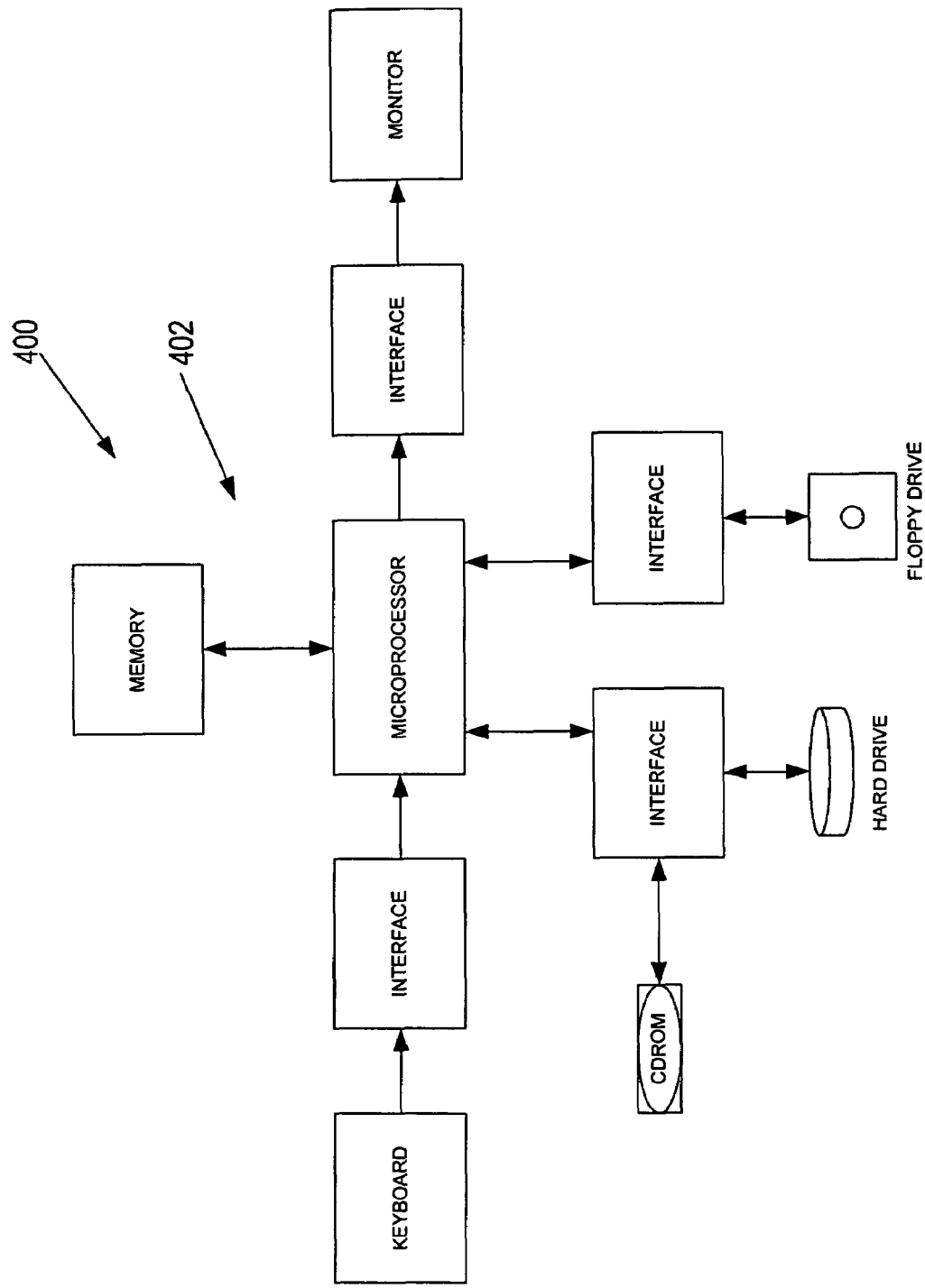

FIG. 19 illustrates yet another system 400 utilizing memory devices as described above. This system 400 is a computer 402 which includes an input in the form of a keyboard, and a microprocessor for receiving signals from the keyboard through an interface. The microprocessor also communicates with a CDROM drive, a hard drive, and a floppy drive through interfaces. Output from the microprocessor is provided to a monitor through an interface. Also connected to and communicating with the microprocessor is memory which may take the form of ROM, RAM, flash and/or other forms of memory. The memory with advantage uses memory devices of the type described above for storage of any data which is of use.

It will be seen that the present approach for programming, erasing and reading resistive memory cells of an array is simple and effective. The process provides for programming, erasing and reading a selected cell of an array without disturbing other cells.

The foregoing description of the embodiment of the invention has been presented for purposes of illustration and description. It is not intended to be exhaustive or to limit the invention to the precise form disclosed. Other modifications or variations are possible in light of the above teachings.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of writing data to a selected memory cell of a memory array, the array comprising a plurality of word lines, a plurality of bit lines, a plurality of memory cells each comprising a diode and a resistive memory device in series connecting a word line and a bit line, and a plurality of transistors, each having first and second source/drain terminals and a gate, each transistor having a first source/drain terminal connected to a bit line, the method comprising applying a voltage to a selected word line, and applying a voltage to the second source/drain terminal of a transistor having its first source/drain terminal connected to a selected bit line, the voltage applied to the selected word line being greater than the voltage applied to the second source/drain terminal of the transistor having its first source/drain terminal connected to the selected bit line.

2. The method of claim 1 wherein the method of writing data to the selected memory cell further comprises applying a voltage to the gate of the transistor having its first source/drain terminal connected to the selected bit line.

3. The method of claim 1 wherein the voltage applied to the selected word line is a pulsed voltage.

4. The method of claim 3 wherein voltages of the successive pulses are of increasing magnitude.

5. The method of claim 2 wherein the voltage applied to the gate is a pulsed voltage.

6. The method of claim 5 wherein voltages of the successive pulses are of increasing magnitude.

7. The method of claim 1 wherein the method of writing data to the selected memory cell further comprises applying a voltage to the second source/drain terminals of other transistors of the array at least as great as the voltage applied to the selected word line.

8. The method of claim 1 wherein the method of writing data to the selected memory cell further comprises applying a voltage to the second source/drain terminals of other transistors of the array less than the voltage applied to the selected word line.

9. The method of claim 1 wherein the writing of data is a programming step.

10. The method of claim 1 wherein the writing of data is an erase step.

11. The method of claim 1 wherein the diode of each memory cell is provided in the forward direction thereof from a word line to a bit line.

12. The method of claim 1 wherein each resistive memory device is a metal-insulator-metal (MIM) memory device.

13. A method of programming a selected memory cell of a memory array, the array comprising a plurality of word lines, a plurality of bit lines orthogonal to the word lines, a plurality of memory cells each comprising a diode and a resistive memory device in series connecting a word line and a bit line adjacent the intersection thereof, and a plurality of transistors, each having first and second source/drain terminals and a gate, each transistor having its first source/drain terminal connected to a bit line, the method comprising applying a voltage to a selected word line, applying a voltage to the second source/drain terminal of a transistor having its first source/drain terminal connected to a selected bit line, the voltage applied to the selected word line being greater than the voltage applied to the second source/drain terminal of the transistor having its first/source/drain terminal connected to the selected bit line, and applying a voltage to the gate of the transistor having its first source/drain terminal connected to the selected bit line.

14. The method of claim 13 wherein the voltage applied to the selected word line is a pulsed voltage, wherein voltages of the successive pulses are of increasing magnitude.

15. The method of claim 13 wherein each resistive memory device is a metal-insulator-metal (MIM) memory device.

16. The method of claim 15 wherein the method of programming the selected memory cell further comprises applying a voltage to the second source/drain terminals of other transistors of the array at least as great as the voltage applied to the selected word line.

17. The method of claim 15 wherein the method of programming the selected memory cell further comprises applying a voltage to the second source/drain terminals of other transistors of the array less than the voltage applied to the selected word line.

18. A method of erasing a selected memory cell of a memory array, the array comprising a plurality of word lines, a plurality of bit lines orthogonal to the word lines, a plurality of memory cells each comprising a diode and a resistive memory device in series connecting a word line and a bit line adjacent the intersection thereof, and a plurality of transistors, each having first and second source/drain terminals and a gate, each transistor having its first source/drain terminal connected to a bit line, the method comprising applying a voltage to a selected word line, applying a voltage to the second source/drain terminal of a transistor having its first source/drain terminal connected to a selected bit line, the voltage applied to the selected word line being greater than the voltage applied to the second source/drain terminal of the transistor having its first source/drain terminal connected to the selected bit line, and applying a voltage to the gate of the transistor having its first source/drain terminal connected to the selected bit line.

19. The method of claim 18 wherein the voltage applied to the gate of the transistor is a pulsed voltage, wherein voltages of the successive pulses are of increasing magnitude.

20. The method of claim 18 wherein each resistive memory device is a metal-insulator-metal (MIM) memory device.

21. The method of claim 20 wherein the method of erasing the selected memory cell further comprises applying a voltage to the second source/drain terminals of other transistors of the array at least as great as the voltage applied to the selected word line.

22. The method of claim 20 wherein the method of erasing the selected memory cell further comprises applying a voltage to the second source/drain terminals of other transistors of the array less than the voltage applied to the selected word line.

23. The method of claim 13 and further comprising erasing the selected memory cell of the memory array, comprising applying a voltage to the selected word line, applying a voltage to the second source/drain terminal of the transistor having its first source/drain terminal connected to the selected bit line, the voltage applied to the selected word line being greater than the voltage applied to the second source/drain terminal of the transistor having its first source/drain terminal connected to the selected bit line, and applying a voltage to the gate of the transistor having its first source/drain terminal connected to the selected bit line.

24. The method of claim 1 and further comprising said device incorporated in a system.

25. The method of claim 24 wherein the system is selected from the group consisting of a hand-held device, a vehicle, and a computer.

\* \* \* \* \*